(12) United States Patent
Okandan et al.

(10) Patent No.: US 10,892,372 B2
(45) Date of Patent: Jan. 12, 2021

(54) HIGH PERFORMANCE SOLAR CELLS, ARRAYS AND MANUFACTURING PROCESSES THEREFOR

(71) Applicant: mPower Technology, Inc., Albuquerque, NM (US)

(72) Inventors: Murat Okandan, Edgewood, NM (US); Jose Luis Cruz-Campa, Waltham, MA (US)

(73) Assignee: mPower Technology, Inc., Albuquerque, NM (US)

( * ) Notice: Subject to any disclaimer, the term of this patent is extended or adjusted under 35 U.S.C. 154(b) by 0 days.

(21) Appl. No.: 15/837,842

(22) Filed: Dec. 11, 2017

(65) Prior Publication Data

US 2018/0166598 A1 Jun. 14, 2018

Related U.S. Application Data

(60) Provisional application No. 62/432,289, filed on Dec. 9, 2016.

(51) Int. Cl.
*H01L 31/0463* (2014.01)
*H01L 31/05* (2014.01)
(Continued)

(52) U.S. Cl.
CPC .......... *H01L 31/0463* (2014.12); *H01L 31/00* (2013.01); *H01L 31/0224* (2013.01);
(Continued)

(58) Field of Classification Search
CPC . H01L 31/0463; H01L 31/0224; H01L 31/05; H01L 31/18; H01L 31/0352;
(Continued)

(56) References Cited

U.S. PATENT DOCUMENTS 4,089,705 A * 5/1978 Rubin .................. H01L 31/042
136/244
4,633,031 A 12/1986 Todorof
(Continued)

FOREIGN PATENT DOCUMENTS

CN 102044580 5/2011
CN 102097541 6/2011
(Continued)

OTHER PUBLICATIONS

"Industry-Specific Laser MicroJet Benefits", https://www.synova.ch/applications/semiconductors-photoviltaics.html, Apr. 23, 2017.
(Continued)

*Primary Examiner* — Michael Y Sun
(74) *Attorney, Agent, or Firm* — Philip D. Askenazy; Peacock Law P.C.

(57) ABSTRACT

High performance single crystal silicon cells and arrays thereof are manufactured using a rapid process flow. Tunneling junctions formed in the process provide performance benefits, such as higher efficiency and a lower power temperature coefficient. The process generates a large array of interconnected high performance cells smaller than typical cells without requiring additional process steps, and simplifies integration of these coupons into the final product. The cells can have different shapes, sizes, and orientations, enabling the array to be flexible in any desired direction. Higher efficiencies and lower hot spotting under shading is achieved by connecting small low current, high voltage cells in dense series and parallel configurations. Low current cells also require much less metallization than typical solar cells and arrays.

18 Claims, 6 Drawing Sheets

(51) Int. Cl.

| | | |
|---|---|---|
| *H01L 31/048* | (2014.01) | |
| *H01L 31/18* | (2006.01) | |
| *H01L 31/0352* | (2006.01) | |
| *H01L 31/042* | (2014.01) | |
| *H01L 31/0475* | (2014.01) | |
| *H01L 31/062* | (2012.01) | |
| *H01L 31/00* | (2006.01) | |
| *H01L 31/0224* | (2006.01) | |
| *B23K 26/00* | (2014.01) | |
| *H01G 9/20* | (2006.01) | |
| *H01L 21/02* | (2006.01) | |
| *H01L 23/00* | (2006.01) | |
| *H01L 21/461* | (2006.01) | |
| *H01L 41/338* | (2013.01) | |
| *H01L 21/78* | (2006.01) | |

(52) U.S. Cl.
CPC .. *H01L 31/0352* (2013.01); *H01L 31/035281* (2013.01); *H01L 31/042* (2013.01); *H01L 31/048* (2013.01); *H01L 31/0475* (2014.12); *H01L 31/05* (2013.01); *H01L 31/0508* (2013.01); *H01L 31/0516* (2013.01); *H01L 31/062* (2013.01); *H01L 31/18* (2013.01); *H01L 31/188* (2013.01); *H01L 31/1892* (2013.01); *H01L 31/1896* (2013.01); *B23K 26/0006* (2013.01); *H01G 9/2068* (2013.01); *H01L 21/02079* (2013.01); *H01L 21/461* (2013.01); *H01L 21/78* (2013.01); *H01L 24/95* (2013.01); *H01L 41/338* (2013.01); *H01L 2224/80947* (2013.01); *H01L 2224/95* (2013.01); *Y02E 10/50* (2013.01); *Y02P 70/50* (2015.11)

(58) Field of Classification Search
CPC ............. H01L 31/00; H01L 31/035281; H01L 31/0508; H01L 31/048; H01L 31/1896; H01L 31/188; H01L 31/042; H01L 31/1892; H01L 31/0475; H01L 31/0516; H01L 31/062; H01L 21/461; H01L 41/338; H01L 21/78; H01L 2224/80947; H01L 21/02079; H01L 24/95; H01L 2224/95; H01L 31/068; H01G 9/20; H01G 9/2068; Y02P 70/50; Y02E 10/50; Y02E 10/547; B23K 26/0006
See application file for complete search history.

(56) References Cited

U.S. PATENT DOCUMENTS

| | | | |
|---|---|---|---|
| 4,805,006 A * | 2/1989 | Yamaguchi | H01L 27/14643 |
| | | | 136/244 |
| 5,374,935 A | 12/1994 | Forrest | |
| 5,407,491 A | 4/1995 | Freundlich et al. | |
| 5,444,249 A | 8/1995 | Wong | |
| 5,457,322 A | 10/1995 | Kitaguchi et al. | |
| 5,730,808 A | 3/1998 | Yang et al. | |
| 5,733,382 A * | 3/1998 | Hanoka | B32B 17/10036 |
| | | | 136/251 |
| 6,490,477 B1 | 12/2002 | Zylka et al. | |
| 6,909,098 B2 | 6/2005 | Bross et al. | |
| 7,567,649 B1 | 7/2009 | Safai et al. | |
| 8,879,688 B2 | 11/2014 | Safai | |
| 8,994,137 B2 | 3/2015 | Padinger | |
| 9,116,249 B1 | 8/2015 | Claus et al. | |
| 9,141,413 B1 | 9/2015 | Cruz-Campa et al. | |
| 9,511,393 B2 | 12/2016 | Safai | |
| 9,559,229 B2 | 1/2017 | Chen | |
| 2003/0155516 A1 | 8/2003 | Spartiotis et al. | |
| 2003/0173523 A1 | 9/2003 | Vuorela | |
| 2009/0071528 A1 | 3/2009 | Chen | |
| 2009/0288702 A1 | 11/2009 | Kim | |
| 2010/0282293 A1 | 11/2010 | Meyer et al. | |
| 2010/0283612 A1 | 11/2010 | Wong et al. | |
| 2010/0327171 A1 | 12/2010 | Robinson et al. | |
| 2011/0005570 A1 | 1/2011 | Jain | |
| 2011/0277835 A1 * | 11/2011 | Masson | H01L 31/022433 |
| | | | 136/256 |
| 2011/0290296 A1 * | 12/2011 | Daniel | H01L 31/042 |
| | | | 136/244 |
| 2012/0000502 A1 | 1/2012 | Wiedeman et al. | |
| 2012/0145231 A1 | 6/2012 | Woods et al. | |
| 2012/0265975 A1 | 10/2012 | Kimelman | |
| 2013/0048861 A1 | 2/2013 | Oyhta et al. | |
| 2013/0161772 A1 | 6/2013 | Chan et al. | |
| 2013/0206219 A1 | 8/2013 | Kurtin et al. | |
| 2013/0213462 A1 | 8/2013 | Lewis et al. | |
| 2013/0264669 A1 | 10/2013 | Li et al. | |
| 2013/0269747 A1 | 10/2013 | Lentine et al. | |
| 2013/0314236 A1 | 11/2013 | Warren | |
| 2013/0344645 A1 | 12/2013 | Ahmari et al. | |
| 2014/0060616 A1 | 3/2014 | Okandan et al. | |
| 2014/0102531 A1 | 4/2014 | Moslehi | |
| 2014/0203392 A1 | 7/2014 | Li et al. | |
| 2014/0266289 A1 | 9/2014 | Della Sera et al. | |
| 2014/0334601 A1 | 11/2014 | Shizukuishi | |
| 2015/0114444 A1 | 4/2015 | Lentine et al. | |
| 2015/0114451 A1 | 4/2015 | Anderson et al. | |
| 2015/0280025 A1 | 10/2015 | Bellanger et al. | |
| 2015/0280641 A1 * | 10/2015 | Garg | H01L 31/0475 |
| | | | 136/244 |
| 2015/0311371 A1 | 10/2015 | Krishnamoorthy | |
| 2015/0349176 A1 * | 12/2015 | Morad | H01L 31/042 |
| | | | 136/251 |
| 2015/0349703 A1 * | 12/2015 | Morad | H01L 31/05 |
| | | | 136/251 |
| 2016/0015350 A1 | 1/2016 | Chang | |
| 2016/0268455 A1 | 9/2016 | Levy et al. | |
| 2016/0284749 A1 | 9/2016 | Kurokawa | |
| 2016/0359637 A1 | 12/2016 | Okandan | |
| 2016/0380143 A1 | 12/2016 | Hekmatshoartabari et al. | |
| 2017/0200762 A1 | 7/2017 | Okandan et al. | |
| 2017/0358041 A1 | 12/2017 | Forbes, Jr. et al. | |

FOREIGN PATENT DOCUMENTS

| | | |
|---|---|---|
| CN | 102157622 | 8/2011 |
| CN | 105023921 | 11/2015 |
| EP | 0109176 | 5/1984 |
| EP | 1770791 | 4/2007 |
| KR | 2010043654 | 4/2010 |
| WO | 2009033215 | 3/2009 |

OTHER PUBLICATIONS

"Stealth Dicing Technology and Applications", https:/www.hamamatsu.com/resources/pdf/etd/SD_tech_TLAS9004E.pdf, Mar. 2005.

Bollier, "The Blockchain: a Promising New Infrastructure for Online Commons", http://bollier.org/blog/blockchain-promising-new-infrastructure-online-commons, Mar. 4, 2015, 1-2.

Kerr, et al., "Surface recombination velocity of phosphorus-diffused silicon solar cell emitters passivated with plasma enchanced chemical vapor deposited silicon nitride and thermal silicon oxide", Journal of Applied Physics, vol. 89, No. 7, American Institute of Physics, Apr. 1, 2001, 3820-3826.

Kim, et al., "Cascade Modeling of Pixelated Scintillator Detectors for X-Ray Imaging", IEEE Transactions on Nuclear Science, vol. 55, No. 3, Jun. 2008, 1367-1366.

Lentine, et al., "Optimal Cell Connections for Improved Shading, Reliability, and Spectral Performance of Microsystem Enabled Photovolutaic (MEPV) Modules", Presented at 35th IEEE PVSC Conference, Jun. 20-25, 2010.

Nikolic, et al., "Fabrication of Pillar-Structured Thermal Neutron Detectors", 2007 IEEE Nuclear Science Symposium Conference Record, 2007, 1577-1580.

(56) References Cited

OTHER PUBLICATIONS

Shen, et al., "Two-terminal Monolithic InP/InGaAsP Tandem Solar Cells with Tunneling Intercell Ohmic Connections", Conference Record of the Twenty Second IEEE Photovoltaic Specialists Conference, Oct. 7, 1991, 381-387.

* cited by examiner

HIGH PERFORMANCE SOLAR CELLS, ARRAYS AND MANUFACTURING PROCESSES THEREFOR

CROSS-REFERENCE TO RELATED APPLICATIONS

This application claims priority to and the benefit of filing of U.S. Provisional Patent Application Ser. No. 62/432,289, entitled "High Performance Solar Cells, Arrays and Manufacturing Processes Therefor", filed on Dec. 9, 2016, the specification and claims of which are incorporated herein by reference.

BACKGROUND OF THE INVENTION

Field of the Invention (Technical Field)

The present invention is related to high performance solar cell structures, arrays made of such cells and the high throughput, low cost manufacturing process for generating such devices and systems.

Background Art

Note that the following discussion may refer to a number of publications and references. Discussion of such publications herein is given for more complete background of the scientific principles and is not to be construed as an admission that such publications are prior art for patentability determination purposes.

Conventional solar cells are generally manufactured with doped junctions and ohmic contacts that are used to collect the photogenerated carriers and deliver them to an external circuit to generate useful work. Use of tunnel junctions for solar cells are well known in the art, as are metal-insulator-semiconductor (MIS) cells or tunnel junctions in multi-junction compound semiconductor cells. Conventional cells are typically interconnected using metal traces that are welded onto the metallization layer that is formed on the cell, usually requiring large amounts of material in each cell and between cells to accommodate the high currents and low voltages generated per cell, to prevent undesirable resistive losses.

The process for deposition of metal traces onto the solar cells typically involves screen printing, inkjet printing, electroplating or vacuum deposition processes, or a combination of several of these steps. Significant efforts are made to make these lines as thin as possible in lateral dimensions for front-and-back contact cells to reduce shading losses created by the opaque metal layer. Once these layers are formed and other metal layers are welded onto the cell, differences in coefficients of thermal expansion between semiconductor and the metal layers cause undesirable mechanical stresses and weak points that can lead to failure of the cell and the array structure. The amount of metal used also adds significant mass to the overall structure, which is an undesirable outcome for applications such as aerospace, where system weight is critically important for the performance of the platform.

There are currently a large number of steps involved in assembling the cells into strings, sub-arrays and finally into panels. Usually these assemblies are laminated together to form the final product, which has a top cover layer, and a back cover layer, glass for the top and polymeric layer for the back. There are also some configurations where both layers are glass or both polymeric.

SUMMARY OF THE INVENTION (DISCLOSURE OF THE INVENTION)

The present invention is an array of interconnected photovoltaic cells comprising a first string of first photovoltaic cells electrically connected in series and a second string of second photovoltaic cells electrically connected in series, the second string electrically connected in parallel with the first string, wherein each of the first cells have a first shape and each of the second cells have a second shape. Each of the first cells preferably has approximately a first surface area and each of the second cells preferably has approximately a second surface area. The first surface area is preferably different than the second surface area. The array is preferably flexible in more than two directions. The voltage generated by the first string is preferably approximately the same as the voltage generated by the second string. The surface area of each of the cells is preferably between about 100 µm$^2$ and about 3000 mm$^2$, and more preferably between about 0.1 mm$^2$ and about 100 mm$^2$. The current produced by each of the cells is preferably less than about 1.1 A, and more preferably less than about 50 mA. Each cell preferably comprises approximately only an amount of current collection metal necessary to limit a power loss through the metal to less than about 10% of a total power available from each the cell.

The present invention is also an array of interconnected photovoltaic cells comprising a first string of first photovoltaic cells electrically connected in series and a second string of second photovoltaic cells electrically connected in series, the second string electrically connected in parallel with the first string, wherein at least one of the first cells has a different shape than another of the first cells and at least one of the second cells has a different shape than another of the second cells. Each of the first cells preferably has approximately a first surface area and each of the second cells preferably has approximately a second surface area. The first surface area is preferably different than the second surface area. The array is preferably flexible in more than two directions. The voltage generated by the first string is preferably approximately the same as the voltage generated by the second string. The surface area of each of the cells is preferably between about 100 µm$^2$ and about 3000 mm$^2$, and more preferably between about 0.1 mm$^2$ and about 100 mm$^2$. The current produced by each of the cells is preferably less than about 1.1 A, and more preferably less than about 50 mA. Each cell preferably comprises approximately only an amount of current collection metal necessary to limit a power loss through the metal to less than about 10% of a total power available from each the cell.

The present invention is also a method for manufacturing an array of interconnected photovoltaic cells, the method comprising partially processing a photovoltaic wafer, adhering the wafer to a stretchable carrier, using a laser to singulate individual photovoltaic cells from the wafer, the individual cells having a plurality of shapes and/or orientations, separating the individual cells while maintaining a relative orientation of the individual cells with respect to each other, electrically interconnecting the individual cells, and removing the array from the carrier, wherein individual cells in the array remain in the relative orientation. The step of using a laser is preferably performed prior to metallizing the cells. The laser optionally comprises a vertical cavity surface emitting laser (VCSEL) or a vertical external cavity surface emitting laser (VECSEL). The separating step preferably comprises stretching the substrate. The distance between cells after the separation step is preferably between approximately 5 μm and 250 μm. The method optionally further comprises adding a flexible insulating layer and/or a flexible insulating and conducting composite layer to the wafer before the removing step.

Objects, advantages and novel features, and further scope of applicability of the present invention will be set forth in part in the detailed description to follow, taken in conjunction with the accompanying drawings, and in part will become apparent to those skilled in the art upon examination of the following, or may be learned by practice of the invention. The objects and advantages of the invention may be realized and attained by means of the instrumentalities and combinations particularly pointed out in the appended claims.

BRIEF DESCRIPTION OF THE DRAWINGS

The accompanying drawings, which are incorporated into and form a part of the specification, illustrate the practice of embodiments of the present invention and, together with the description, serve to explain the principles of the invention. The drawings are only for the purpose of illustrating certain embodiments of the invention and are not to be construed as limiting the invention. In the figures.

DETAILED DESCRIPTION OF EMBODIMENTS OF THE INVENTION

Figure 1:
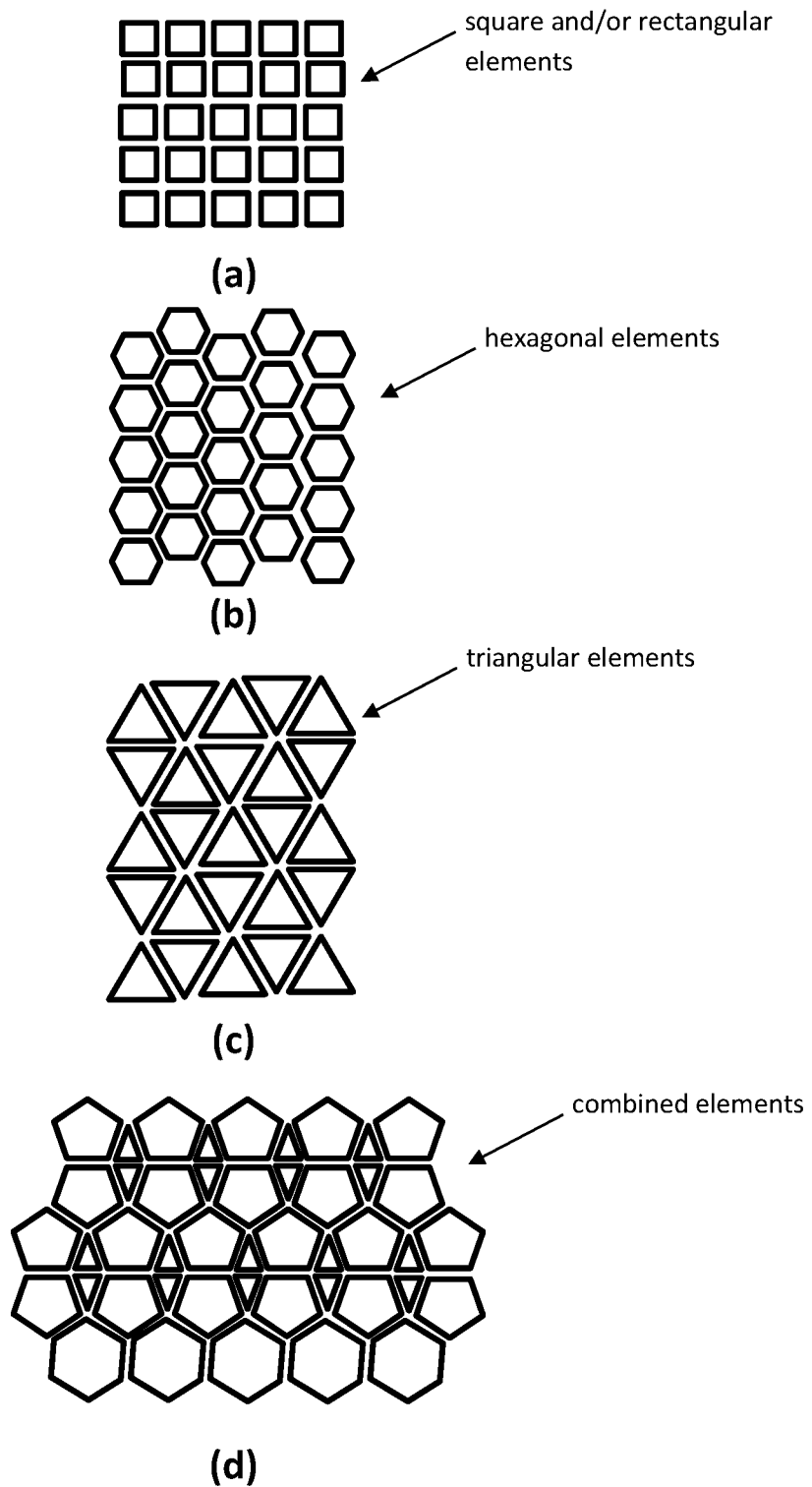
FIG. 1 shows rectangular and compound shape formed arrays of solar cells.

Several valuable improvements to solar cell structures are provided by the use of tunneling junctions rather than standard doped junctions, as well as integration of processing steps that allow a large number of cells to be manufactured into a sub-array that produces high voltages that can be directly bonded into a panel or another system without requiring additional assembly steps. Some of the benefits provided by the tunneling junctions are: elimination of carrier recombination at highly doped junctions, reduction of surface recombination velocity at the surfaces passivated by thin tunneling oxide and other passivating oxides around non-junction regions, reduced costs from elimination of expensive metals (e.g. silver) in the fabrication process, and simplified and faster process flow and an improved power thermal coefficient (approximately −0.2%/° C. compared to −0.4%/° C. for conventional Si cells). An embodiment of the manufacturing process preferably starts by oxidation and silicon nitride deposition around the whole wafer for a process flow using solar wafers. When integrated circuit process wafers and tools are utilized, the active devices are preferably formed in the device layer of a silicon-on-insulator (SOI) wafer or on a wafer that has an internal separation layer built-in, such as amorphous silicon. The areas where tunneling junctions are formed are preferably defined by patterning and etching the silicon nitride/oxide passivation stack. This patterning can be carried out by standard lithographic techniques and etching, by printing based techniques, such as forming a mask and dry or wet etching or by direct printing of an etchant, or by laser removal of the insulating layers. The tunneling junctions may be formed by any method, such as growth of a tunneling layer by rapid-thermal process (RTP) oxidation, furnace oxidation, deposition by plasma enhanced chemical vapor deposition (PECVD), or sputtering. The tunneling layer formed preferably comprises silicon dioxide ($SiO_2$) or other insulating films such as aluminum oxide ($Al_2O_3$) or undoped amorphous silicon in the range of 1 nm to 3 nm that allows carriers to tunnel from active cell material (silicon) into the contact material. Contact materials are typically selected based on the work-function difference between the metal and/or doped silicon and substrate silicon to create the right type of band-bending in substrate silicon. This induced band-bending causes one type of the carriers (for example, electrons) to be pulled towards the contact and the other type (in this example, holes) to be pushed away from the contact. As the carriers tunnel out to the contact material, a concentration gradient is formed that also induces more carriers to be pulled towards the contact. The contact material could be doped polysilicon (n and p-type), aluminum, titanium, tungsten, transparent conducting oxides (for example indium tin oxide-ITO) or other metals or a combination of these materials, deposited as thin metal stacks. The deposition could be done by vacuum deposition methods using a shadow mask for different contacts (n and p-type), ink-jet printing or screen printing. Regular lithographic methods could also be utilized which allow higher precision geometries to be defined; however, those steps are costlier than the previous methods mentioned. An insulating layer such as polyimide or oxide is preferably then deposited on the first metal layer. Contact holes in this layer are preferably formed by printing based methods (for example, inkjet printed polyimide, or inkjet printed mask) or by standard lithography methods using a photodefinable insulating layer or imaging layer. A second layer metal (metal2) is then preferably deposited, patterned by printing methods or by lithographic methods (such as lift-off or masking/etching based). Another insulating layer is preferably deposited on top of this metal layer, which could be silicon nitride and polyimide or just a polymeric layer (e.g. polyimide) and contact pads are defined using direct patterning with printing or by lithographic methods.

A pattern is then preferably formed on the opposite side of the wafer from the metallization side, preferably by printing or lithographic methods. Silicon nitride/oxide passivation is etched, and silicon is etched to singulate the individual cells. In cases where a thinner silicon layer is desired, the silicon can be thinned by polishing or etching methods, which could also texturize the surface for trapping incoming light, and then the trench patterning step is carried out. A passivating layer of silicon dioxide/silicon nitride or amorphous silicon/silicon nitride or silicon nitride is deposited, which passivates the sidewalls (and the full surface area in the case where silicon was thinned). The thickness of this layer is preferably optimized to achieve the best antireflection properties to allow the maximum amount of light to enter the silicon. The etching step preferably separates all the individual cells and allows the resulting device to be flexible, deformable and very robust to handling as compared to large cells.

The separation of individual cells can also be carried out using a laser based method such as stealth dicing, preferably either by completely removing silicon or by forming a crack initiation region with subsequent mechanical separation of the silicon regions by mechanical loading. The mechanical loading can be generated by using a focused light source, such as a fiber laser, vertical cavity surface emitting laser (VCSEL), or vertical external cavity surface emitting laser (VECSEL) with appropriate optical elements. Localized regions at high temperatures generated by a focused laser spot are then rapidly cooled, such as with an air jet or liquid jet, which generates the desired thermally driven mechanical loading that propagates the separation front. This process is preferably controlled by a high speed machine vision system similar to a high speed printing process which improves both throughput and process quality. The silicon wafer (which can be a semiconductor grade circular wafer or photovoltaic square/pseudo-square or any shape wafer) is preferably attached to a stretchable carrier, and then the laser irradiation step referred to above is performed. In the mechanical separation case, the stretchable carrier is preferably stretched to pull the individual regions apart, generating a preferable separation of 5-250 µm between the cells. Once individual regions are separated, sidewalls of the individual cells can be passivated as described above, or left as is. An additional flexible insulating layer is preferably then applied to the device on the metallized side, and a metal layer is formed as described above, which could take place of the metal2 layer or alternatively be an additional routing layer.

In the process described above, the cells can be cut in arbitrary shapes, sizes, and orientations. In the prior art, cells which are laser cut are subsequently removed from the carrier, laminated, and assembled into the desired string or module configuration using module stringing techniques such as a tabber stringer machine. Semiconductor devices (e.g. integrated circuits, diodes, capacitors, and resistors) manufactured using similar techniques are removed from the carrier using, for example, pick and place technology; they are subsequently used separately and not connected together. In contrast, in embodiments of the present invention, after the individual cells are cut and separated, they preferably stay in the same orientation relative to each other, for example by manufacturing the cells on a tacky or adhesive substrate. They are then interconnected preferably while maintaining the relative orientation, which is thus preferably the same orientation of shapes and sizes of cells desired for the final module or array configuration. Thus one or more typical assembly steps are avoided, reducing time and cost for assembly.

The shape and mechanical features of regions that are formed in the separation step can provide enhanced mechanical and electrical resilience of embodiments of the present invention. The individual cell shapes, such as hexagons, triangles, or other shapes (including combinations of different shapes) enable the assembly of cells and/or other electronic components to bend and flex in multiple directions, and optionally also in preferred locations, which prevents the array from being mechanically damaged when it is flexed. In comparison, a square or rectangular shape cell could be used, but that provides preferred bending in 2 directions only. This is suitable for certain applications but not as enabling as the more advanced shapes and combinations of shapes that allow three and more axes for bending. FIG. 1 is a schematic representation of various shapes and combined complex shape arrays that provide this capability. By combining various similar or different shaped array elements to produce a common voltage, the low current, high voltage sub-arrays can be combined in arbitrary ways with other sub-arrays without incurring any performance penalties that would occur due to current mismatches in conventional series combination of solar cells. If it is assumed that solar cells in general have a 1% variation in current output (due to variations in surface area or even if they have the same surface area due to production variations), with the small cells of the present invention, which produce a few to tens of mA, such variation results in much smaller (about three orders of magnitude less) losses than those that would result from the typical larger cells of the prior art, which typically produce amps (e.g. 9 A) of current. In order to avoid such losses, cells currently in use are tested and sorted by output so they can be matched. Because of both the reduced losses and because sub-arrays are connected in parallel with other sub-arrays, the present invention does not require this step, reducing manufacturing time and cost.

For example, a combination of triangular elements can be connected in series to reach a common voltage (for example 1V or 6V), and putting that sub-array in parallel with another sub-array of triangles, hexagons or pentagons that are also grouped at the same voltage provides the desired balanced output. Each sub-array of interconnected cells to reach the common voltage preferably comprises substantially the same area so that all of the cells produce about the same current; however, the cells may have the same or different shapes or orientations. And, as discussed above, even if the cells are not exactly the same surface area (and even if such difference is greater than typical manufacturing variations), the losses due to such area differences are much smaller than those that would occur with typical, larger cells. At the common voltage (parallel) connection step, the surface area of each of the cells in one sub-array can be very different than the area of each of the cells in a different sub-array. This ability to interconnect various shapes and cover desired areas without the limitation of fixed solar cell element and array sizes and shapes is a key benefit over conventional solar cell interconnect approaches in areas smaller than conventional solar cell sizes, since the combination of arbitrary shapes and sizes of cells enables the arrays of the present invention to synergistically improve mechanical flexibility and enhance mechanical and electrical reliability at the same or better efficiency.

The circuit connections in metal1 and metal2 layers that were formed in the process flow interconnect the array of high performance cells in a dense network, providing robustness against device and processing variations, shading, and damage during operation. The high voltages formed as a result of connecting large numbers of cells in series and parallel networks synergistically enables thinner metal layers to be utilized in this structure, which not only reduces materials cost but is also a key benefit in applications where weight is of critical importance (such as aerospace). For example, for typical high efficiency solar cells of the prior art, the size of a typical current collecting line on each cell is about 400 µm to 50 µm wide and from about 20 µm to 500 µm thick; alternatively, 250 µm to 500 µm diameter round lines are commonly used. Interconnects between those cells are typically several mm to a cm wide and several hundred microns thick. In contrast, embodiments of the present invention comprise current collector lines on each cell having a current collecting metal thickness about 1 µm to 10 µm and a width of about 10 µm to 100 µm on each cell, and interconnects approximately 1 micron to 20 microns thick and 5 microns to 500 microns wide. Thus the amount of metal used in the present invention can be over 100 times less than that required currently. Furthermore, large cells of the prior art each produce about 0.5 V. By combining smaller cells in series/parallel configurations of the present invention, cells having the same surface area as a larger cell of the prior art can produce on the order of 50 V. That means that the current produced for the same area of solar cell is about 100 times less for the same amount of power. This results in resistive losses on the order of 10,000 times less than existing systems, enabling the use of less current collecting metal. The ability to use non-precious commodity metals (such as copper) and smaller amounts of those commodity metals is another advantage, especially in applications where cost is the key metric (such as utility scale, commercial and residential rooftop and building integrated photovoltaics). Careful design of the metallization pattern on the contact side enables the maximum amount of light to enter the cell from that surface in addition to the unshaded, direct light input side. While this feature is not beneficial in applications where the metallization side is blocked by or embedded in an opaque material, in other applications where there is a transparent or semi-transparent layer on the contact side this additional level of energy can be harvested to provide additional power output. Conventional front-and-back contact cells have a completely metallized back side, so such a benefit is not available in those cell configurations. In the case of a transparent or semi-transparent back sheet and interconnect substrate, a laser driven process can be used to a create point-like joint of about 5 µm to 50 µm-100 µm in lateral dimension between the metal on the solar cell and the metal traces that are on the interconnect substrate, formed by an insulating layer and conductive traces. Since the metal layers are preferably thin (from less than about 1 µm to about 5-10 µm) both on the cell and the interconnect substrate, the amount of energy needed to create the laser driven point-welds is very small, compared to the energy levels needed for creating welds in conventional, thick metal laser welding. This enables the use of focused arrays of semiconductor lasers such as VCSELs and VECSELs for this process, which are much more efficient and more reliable than other laser sources. These devices can be embedded on a small moving head in the process tool and directly driven by electrical connections, rather than having to route high power external laser sources through high power fiber optic cables.

Figure 2:
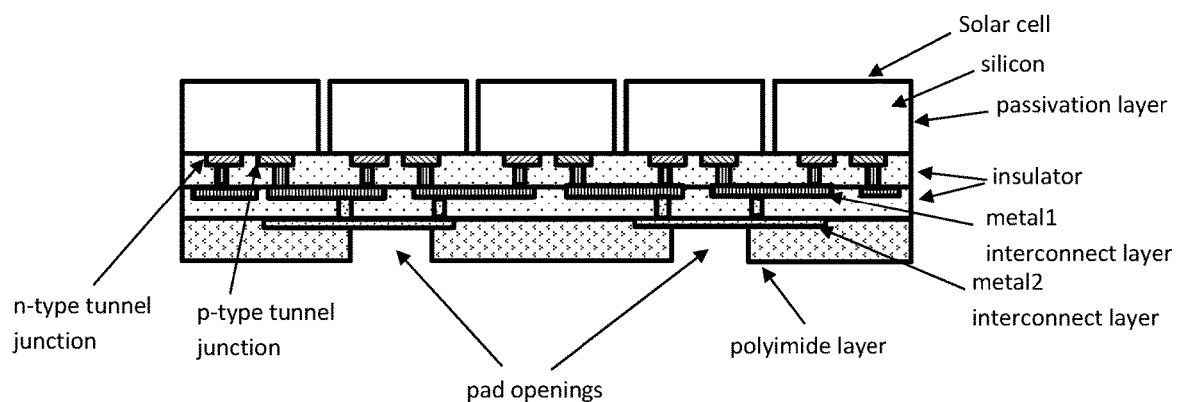
FIG. 2 shows a schematic of a cross section of a basic micro-cell structure and interconnects.

FIG. 2 is a schematic representation of the micro-scale tunneling junction cells and the interconnected network formed during the processing of these cells and arrays. The metallization layers used for forming the tunneling junctions are preferably left only around the thin tunneling insulator layer, or alternatively they can be formed into local interconnections as elongated structures. These regions are then preferably further interconnected by metal1 and metal2 layers, forming the complete network. A polyimide or other similar layer provides added stability and flexibility for the structure, and the openings in the polyimide layer also allow solder, conductive epoxy or other electrical connections to be formed with the system in which these cells and arrays are integrated.

Figure 3:
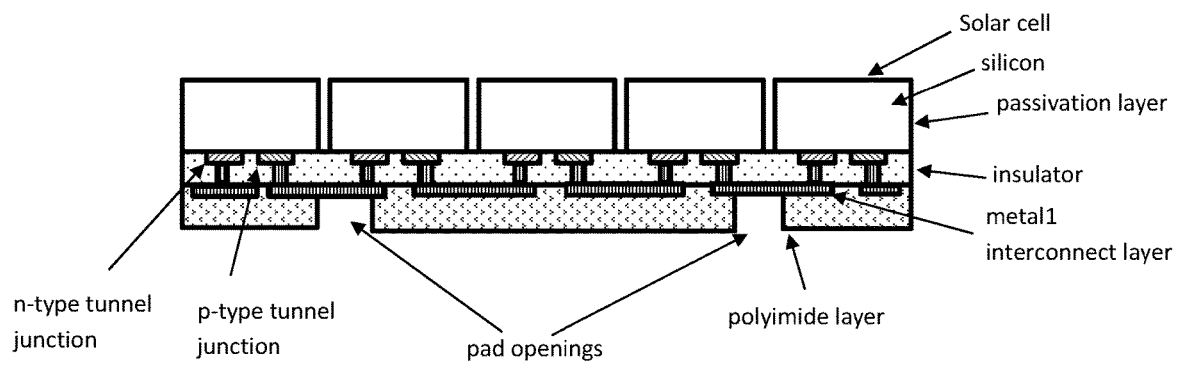
FIG. 3 shows an alternative embodiment of the structure of FIG. 1 where only metal1 is used to form the interconnects.

FIG. 3 is a schematic representation of an alternative embodiment of the structure where only metal1 layer is used to form the interconnects between individual cells.

Figure 4:
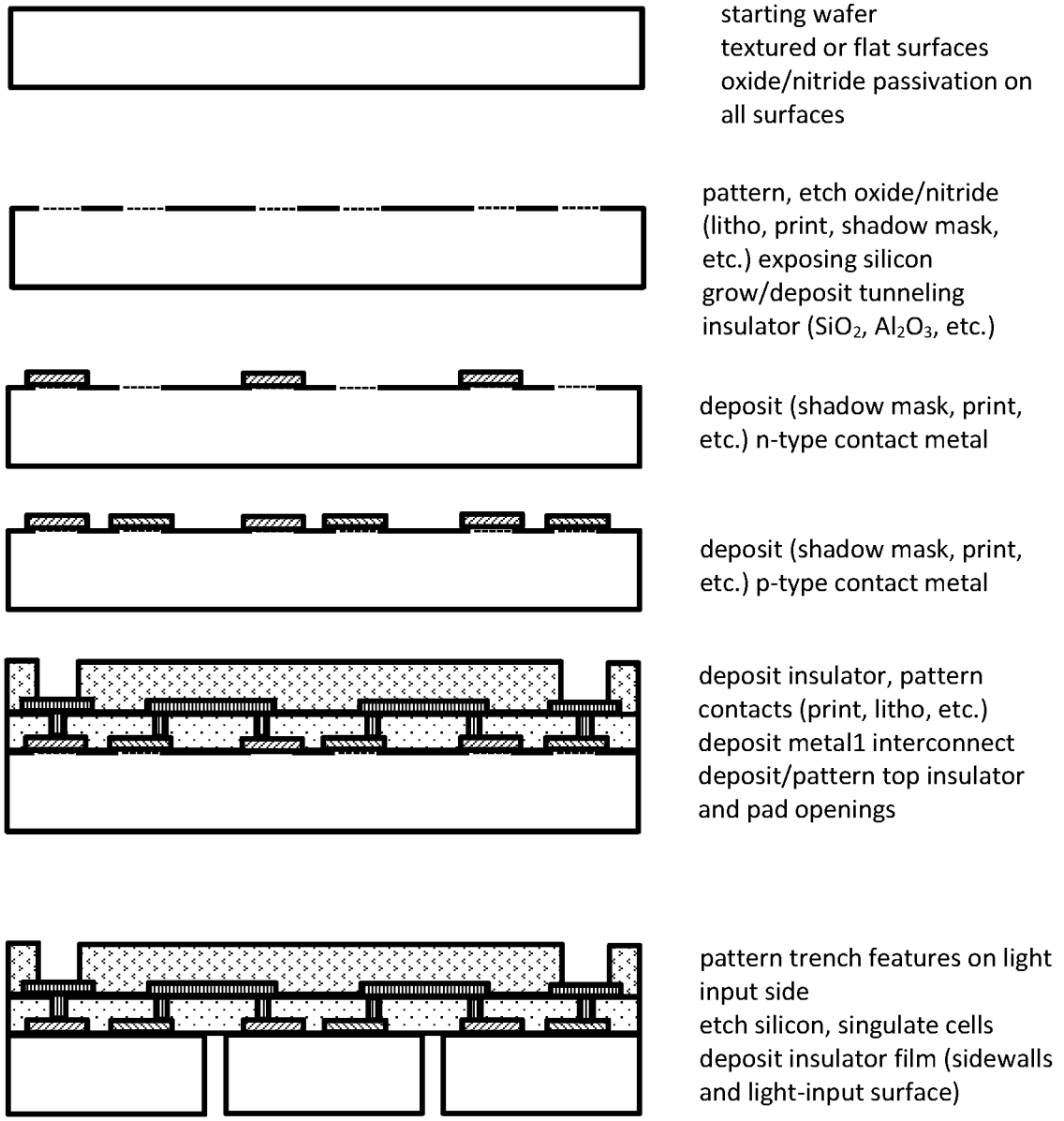
FIG. 4 shows a process flow for an embodiment of the present invention for creating cells and arrays using solar cell manufacturing tools and solar wafers.

FIG. 4 shows a process flow using solar cell manufacturing tools and wafers for creating the cells and arrays. This process embodiment starts by oxidation and nitride deposition around the whole structure. Then areas for forming the junctions are defined by patterning and etching or other techniques that remove the nitride/oxide stack, exposing bare silicon. The tunneling insulator (thermally grown or deposited oxide, alumina, etc.) is then formed in these open areas. A metal that forms a n-type tunneling junction (such as tungsten or n-type heavily doped polysilicon) is then deposited on the n-contact areas and other areas to form interconnections. Another metal can be deposited on top with the same features to reduce series resistance as needed. Next, a metal that forms a p-type tunneling junction (such as aluminum or p-type heavily doped polysilicon) is deposited onto the p-contact areas and other areas to form interconnections. Another metal can be deposited on top of the same features to reduce series resistance as needed. The remaining part of the interconnection is preferably formed by depositing and patterning an insulator and another metal (preferably a solderable metal or metal stack). Final interconnect passivation is preferably accomplished by depositing another insulator (for example polyimide, which also provides mechanical support and flexibility) and patterning pad openings for connection of the cell array to another circuit. Individual cells are preferably singulated by patterning a mask on the light input side of the wafer, etching through the silicon and depositing a passivating film on that side of the wafer (silicon dioxide/nitride, amorphous silicon/nitride or nitride) at a temperature that is compatible with the materials in the metallization side stack. If necessary, silicon can be thinned by polishing, grinding, or etching before the trenches are defined to provide a thinner, lighter structure.

Figure 5:
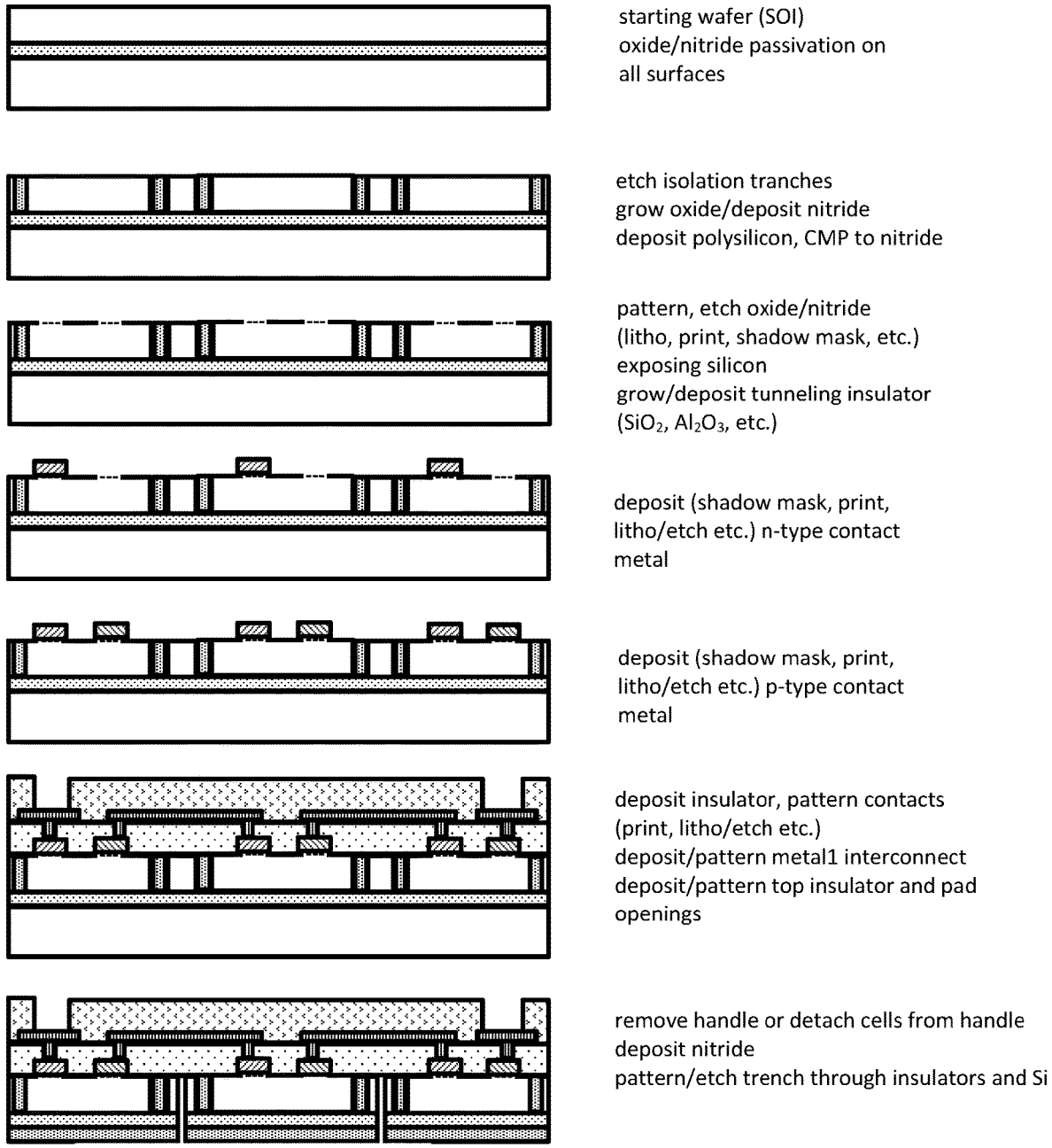
FIG. 5 shows a process flow for an embodiment of the present invention for creating cells and arrays using microelectronics manufacturing tools and integrated circuit (IC) wafers.

FIG. 5 shows a process flow using integrated circuit manufacturing tools and wafers for creating the cells and arrays. Most of the process steps are common with the solar tool process flow, but since a silicon-on-insulator or internal separation layer wafer is used, there are some differences. Trenches are etched into the device layer, oxide/nitride passivation is grown or deposited and polysilicon fill and CMP are done before the tunneling insulator and contact formation steps. A metallization stack for interconnection of the cells is carried out in a similar fashion to the solar process flow. The device layer is separated from the handle layer, or the handle layer is removed to expose the buried dielectric or the bare silicon surface depending on wafer type. Additional oxide and nitride passivation layers are deposited. A trench pattern is defined by printing or by lithography, and trenches are etched to singulate individual cells. To facilitate these processing steps, the wafer can be temporarily bonded to a carrier wafer which allow standard handling procedures to be used for these steps. After completion of the process, cell arrays (coupons) are separated from the carrier wafer. This layer can be used as one contiguous sheet or separated further into smaller pieces depending on the application requirements and integration needs of the system.

Figure 6:
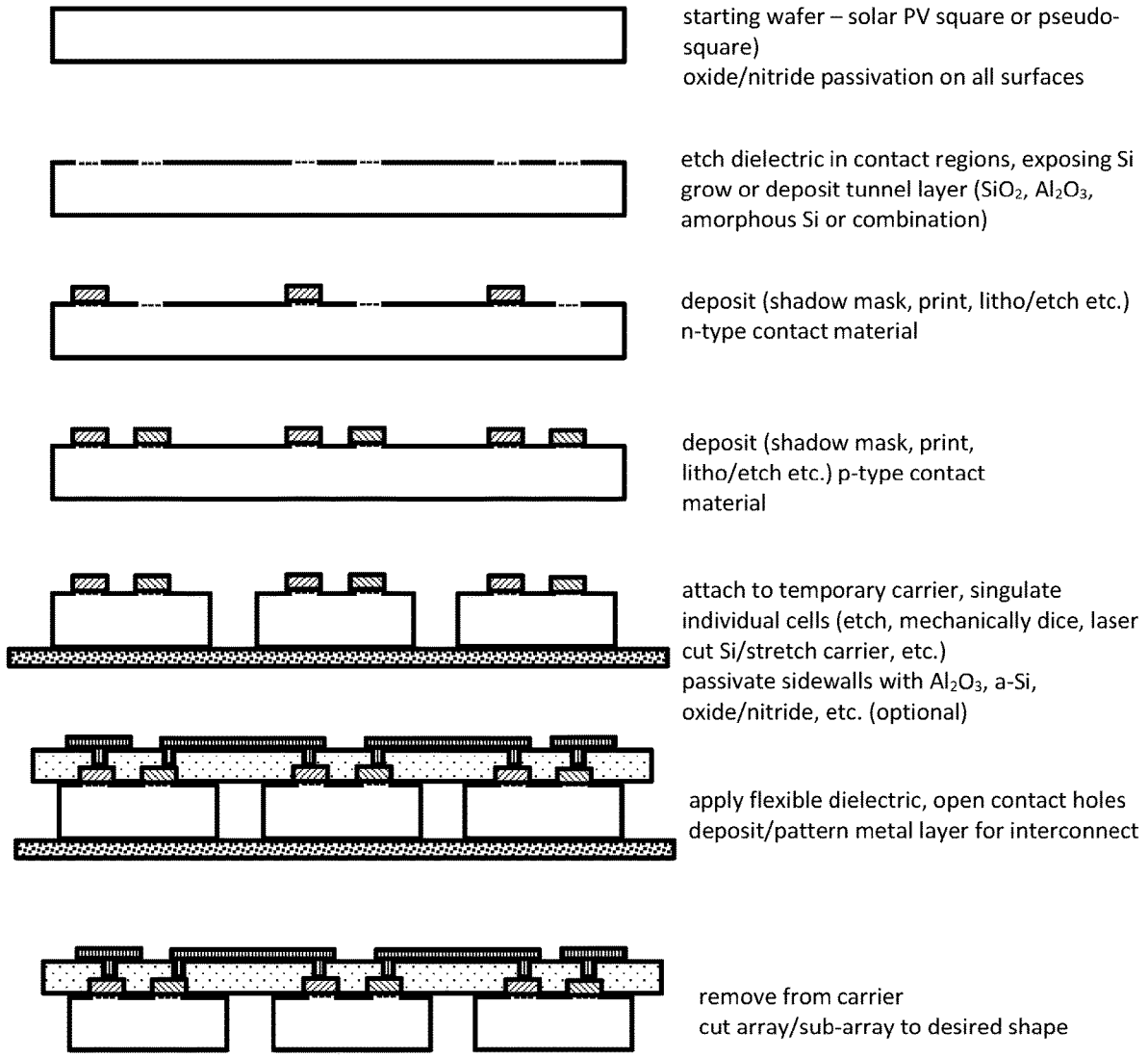
FIG. 6 shows a process flow using square or pseudo-square solar photovoltaic (PV) wafers and process steps for generating the solar cell arrays.

FIG. 6 shows a process flow using a solar PV starting wafer (square or pseudo-square) and high throughput PV process tools. Processing preferably starts with a solar PV industry pseudo-square or square wafer, which could be single crystal or multi-crystalline. An insulating layer, silicon dioxide/silicon nitride stack or other insulating material or a combination of such layers, preferably passivates the whole substrate. Contact regions are preferably etched on the same surface, exposing silicon. These regions are preferably coated with a thin (5-30 Angstroms) insulating layer that serves as a tunneling dielectric. This could be $SiO_2$, silicon nitride, amorphous silicon, $Al_2O_3$, another suitable dielectric or a combination thereof. N-type contact and p-type contact materials (metals, heavily doped polysilicon, or combinations) are preferably then deposited and patterned on corresponding contact locations. The substrate is then preferably attached to a temporary carrier, rigid or flexible, to facilitate the following process steps. Individual cells are then separated preferably using etching, mechanical dicing or laser dicing methods. Sidewalls of the cells can then optionally be passivated using a suitable dielectric layer or a combination of layers. A flexible dielectric is then preferably applied to the surface with contact layers and contact openings are formed in this layer. Alternatively, the contacts are formed in the flexible dielectric layer before attachment to the substrate. Metal traces are then preferably formed on the device, by deposition and patterning methods such as sputtering through a shadow mask, screen printing, ink-jet printing, deposition, lithographic patterning and etching. As described above, the flexible dielectric layer could also contain the desired metal traces to form the interconnect substrate, providing the electrical connections for the overall structure, which are then connected to the conductive regions on the cells by conductive epoxy, solder and/or laser process driven point-welding. The fabricated device is then removed from the carrier, and cut into a desired shape if necessary.

Figure 7:
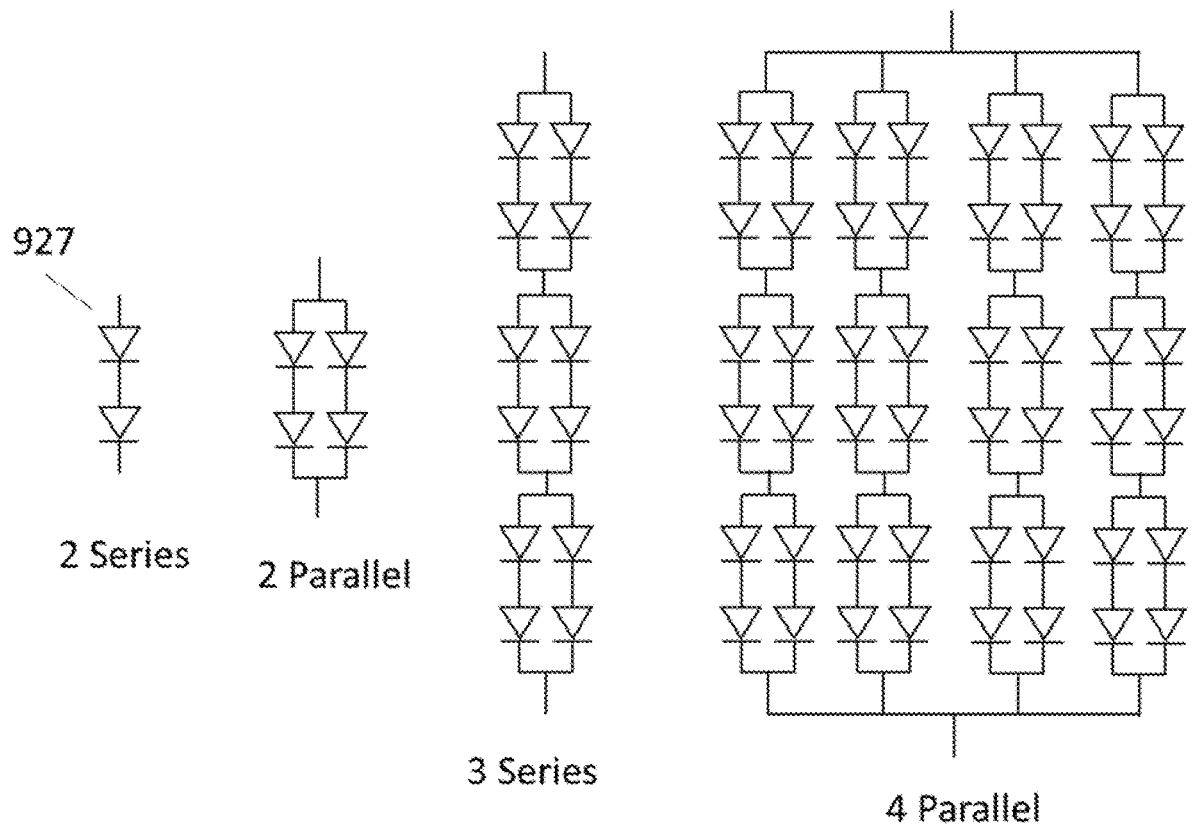
FIG. 7 shows examples of interconnections of micro-solar cells.

In embodiments of the present invention, the very large number of small size cells, optionally on the order of 1 mm lateral dimension or less, are interconnected very differently from how conventional solar cells, which are typically on the order of 24,000 $mm^2$, are interconnected. Cells of the present invention are preferably from about 100 $\mu m^2$ to about 3000 $mm^2$ in area, more preferably from about 0.01 $mm^2$ to about 625 $mm^2$, and even more preferably from about 1 $mm^2$ to about 50 $mm^2$. Similarly, in embodiments of the present invention, the current produced by each cell is preferably less than about 1.1 A, more preferably less than about 0.25 A, and even more preferably less than about 20 mA. In existing practice, solar cells are typically interconnected in series to achieve the nominal module voltage. Then these modules are interconnected in series to achieve a string voltage which connects to inverters or other next stage power handling components. With micro-cells of the present invention, the cells are interconnected in small multiples to form smaller subsets which are then further interconnected in varying series-parallel combinations that confer higher system reliability, shading tolerance, robustness against component variations or failures which is not feasible with larger scale cells. For example, in typical existing systems, because large solar cells are connected in series, even partial shading of only one cell will lower the current and voltage produced by its entire substring of cells. The substring is typically then turned off, for example by use of a bypass diode, both so that the rest of the string can continue to operate at full power. However, this does not eliminate the problem of a hot spot, where the shaded cell can increase in temperature to 150° C. to 200° C. within seconds and remain at that temperature until the shade is removed. In contrast, because cells of the present invention are relatively small and preferably arranged in a dense, low current network configuration, with fewer cells in series in each sub-array, even though a larger number of smaller cells might be shaded, the cells that aren't shaded in the sub-array can still provide power at lower current and slightly lower voltage. Because the current is so small, and there are so many other paths available to collect power, overheating of the shaded cell(s) is not an issue, thereby increasing reliability of the system. The other sub-arrays (which are connected in parallel) can continue to produce power at full current. The dense, low level network configuration is thus able to average out local variations, resulting in a higher efficiency system. For example, as shown in FIG. 7, micro-solar cell 927 is connected in series with another micro-solar cell to form a "2 series" configuration. This unit is then replicated and connected in parallel to form the next "2 parallel" set, which is then replicated 3 times and connected to form the next "3 series" set, which is then replicated 4 times and connected in parallel to form the next "4 parallel" set. These units are repeated multiple times to reach the desired system configuration in terms of voltage, current and area coverage. These interconnections are fabricated all at once in the process, which greatly simplifies manufacturing, reduces costs and increases reliability.

Note that in the specification and claims, "about" or "approximately" means within twenty percent (20%) of the numerical amount cited. As used herein, the singular forms "a," "an," and "the" include plural referents unless the context clearly dictates otherwise. Thus, for example, reference to "a functional group" refers to one or more functional groups, and reference to "the method" includes reference to equivalent steps and methods that would be understood and appreciated by those skilled in the art, and so forth.

Although the invention has been described in detail with particular reference to the disclosed embodiments, other embodiments can achieve the same results. Variations and modifications of the present invention will be obvious to those skilled in the art and it is intended to cover all such modifications and equivalents. The entire disclosures of all patents and publications cited above are hereby incorporated by reference.

What is claimed is:

1. A solar cell array assembly comprising interconnected photovoltaic cells, the solar cell array assembly comprising:
   a flexible substrate;
   a first string of first non-overlapping singulated photovoltaic cells electrically connected in series; and
   a second string of second non-overlapping singulated photovoltaic cells electrically connected in series, said second string electrically connected in parallel with said first string;
   wherein each of said first non-overlapping singulated photovoltaic cells have a first shape and a first area and each of said second non-overlapping singulated photovoltaic cells have a second shape different from said first shape and a second area different from said first area;
   wherein said first non-overlapping singulated photovoltaic cells are intermingled with said second non-overlapping singulated photovoltaic cells on said flexible substrate; and
   wherein said different shapes and said intermingling enable the solar cell array assembly to be flexible in more than two directions.

2. The solar cell array assembly of claim 1 wherein each of said first non-overlapping cells has approximately a first surface area and each of said second non-overlapping cells has approximately a second surface area.

3. The solar cell array assembly of claim 2 wherein said first surface area is different than said second surface area.

4. The solar cell array assembly of claim 1 wherein a voltage generated by said first string is approximately the same as a voltage generated by said second string.

5. The solar cell array assembly of claim 1 wherein a surface area of each of said cells is between about 100 μm$^2$ and about 3000 mm$^2$.

6. The solar cell array assembly of claim 5 wherein a surface area of each of said cells is between about 0.1 mm$^2$ and about 100 mm$^2$.

7. The solar cell array assembly of claim 1 wherein a current produced by each of said cells is less than about 1.1 A.

8. The solar cell array assembly of claim 7 wherein a current produced by each of said cells is less than about 50 mA.

9. The solar cell array assembly of claim 1 wherein each said cell comprises approximately only an amount of current collection metal necessary to limit a power loss through said metal to less than about 10% of a total power available from each said cell.

10. A solar cell array assembly comprising interconnected photovoltaic cells, the solar cell array assembly comprising:
a flexible substrate;
a first string of first non-overlapping singulated photovoltaic cells electrically connected in series; and
a second string of second non-overlapping singulated photovoltaic cells electrically connected in series, said second string electrically connected in parallel with said first string;
wherein at least one of said first non-overlapping singulated photovoltaic cells has a different shape and a different size than another of said first non-overlapping singulated photovoltaic cells and at least one of said second non-overlapping singulated photovoltaic cells has a different shape and a different size than another of said second non-overlapping singulated photovoltaic cells;
wherein said first non-overlapping singulated photovoltaic cells are intermingled with said second non-overlapping singulated photovoltaic cells on said flexible substrate; and
wherein said different shapes and said intermingling enable the solar cell array assembly to be flexible in more than two directions.

11. The solar cell array assembly of claim 10 wherein each of said first non-overlapping cells has approximately a first surface area and each of said second non-overlapping cells has approximately a second surface area.

12. The solar cell array assembly of claim 11 wherein said first surface area is different than said second surface area.

13. The solar cell array assembly of claim 10 wherein a voltage generated by said first string is approximately the same as a voltage generated by said second string.

14. The solar cell array assembly of claim 10 wherein a surface area of each of said cells is between about 100 μm$^2$ and about 3000 mm$^2$.

15. The solar cell array assembly of claim 14 wherein a surface area of each of said cells is between about 0.1 mm$^2$ and about 100 mm$^2$.

16. The solar cell array assembly of claim 10 wherein a current produced by each of said cells is less than about 1.1 A.

17. The solar cell array assembly of claim 16 wherein a current produced by each of said cells is less than about 50 mA.

18. The solar cell array assembly of claim 10 wherein each said cell comprises approximately only an amount of current collection metal necessary to limit a power loss through said metal to less than about 10% of a total power available from each said cell.

* * * * *